United States Patent
Rottela et al.

(10) Patent No.: US 10,574,273 B1
(45) Date of Patent: Feb. 25, 2020

(54) SYSTEMS AND METHODS FOR A LOG-LIKELIHOOD RATIO BASED DYNAMIC SCALING SCHEME FOR FORWARD ERROR CORRECTION

(71) Applicant: Marvell International Ltd., Hamilton (BM)

(72) Inventors: Sri Varsha Rottela, Visakhapatnam (IN); Vijay Ahirwar, Bhopal (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/792,348

(22) Filed: Oct. 24, 2017

Related U.S. Application Data

(60) Provisional application No. 62/412,232, filed on Oct. 24, 2016.

(51) Int. Cl.
  *H03M 13/00* (2006.01)
  *H03M 13/39* (2006.01)
(52) U.S. Cl.
  CPC .............................. *H03M 13/3927* (2013.01)
(58) Field of Classification Search
  CPC .................................................. H03M 13/3927
  See application file for complete search history.

(56) References Cited

U.S. PATENT DOCUMENTS

| | | | |
|---|---|---|---|
| 7,876,860 B1* | 1/2011 | Varnica | H04L 1/0054 |
| | | | 375/340 |
| 8,286,048 B1* | 10/2012 | Chen | H03M 13/1128 |
| | | | 714/752 |
| 2013/0051444 A1* | 2/2013 | Roh | H03M 13/612 |
| | | | 375/222 |
| 2015/0135031 A1* | 5/2015 | Cohen | G06F 11/1068 |
| | | | 714/758 |
| 2016/0226528 A1* | 8/2016 | Serbetli | H03M 13/6502 |
| 2016/0233979 A1* | 8/2016 | Koike-Akino | H03M 13/1111 |

* cited by examiner

*Primary Examiner* — Samir W Rizk

(57) ABSTRACT

Embodiments described herein provide a method for dynamically scaling log-likelihood ratio (LLR) values of received data bits before decoding the received data bits. A plurality of data bits are received corresponding to a data packet. A first set of data bits of a first type are determined from the plurality of data bits based on a modulation scheme corresponding to the received data bits. A first LLR histogram is generated corresponding to the first set of data bits of the first type. A first scaling factor is calculated based on the first LLR histogram such that a first LLR value range corresponding to the first set of data bits is expanded to a maximum LLR value range. All LLR values are scaled by the first scaling factor. The scaled LLR values corresponding to the plurality of data bits are sent to a decoder.

20 Claims, 7 Drawing Sheets

US 10,574,273 B1

SYSTEMS AND METHODS FOR A LOG-LIKELIHOOD RATIO BASED DYNAMIC SCALING SCHEME FOR FORWARD ERROR CORRECTION

CROSS-REFERENCE TO RELATED APPLICATION

This disclosure claims the benefit under 35 U.S.C. § 119(e) of U.S. Provisional Patent Application No. 62/412,232, filed Oct. 24, 2016, which is hereby incorporated by reference herein in its entirety.

FIELD OF USE

This disclosure relates to decoding pre-processing, and specifically, to a log-likelihood ratio (LLR) based dynamic scaling scheme for forward error correction (FEC) in a decoder.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

In existing communication systems, forward error correction (FEC) is widely used for data transmission. For example, a transmitter usually employs an FEC scheme to send parity data bits in addition to the actual data bits, and the receiver performs the reverse FEC scheme to recognize the portion of the actual data bits from the received data bits. At the receiver, the LLR values of the received data bits are sent to the FEC, before the LLR values are sent to a decoder. In particular, a high LLR value corresponds to high reliability of the respective data bit, e.g., the data bit is less affected by channel noise and is more likely to be accurately decoded. On the contrary, a low LLR value (e.g., close to zero) corresponds to low reliability, e.g., the received data bit can be ambiguous for decoders. The LLR values corresponding to received data bits at a receiver may vary significantly, due to varying channel conditions, different modulation and coding schemes (MCSs), changing signal power level of the received signal, and/or the like. Thus, it remains challenging for a decoder to maintain decoding accuracy for certain data bits when the LLR values are relatively low (e.g., close to zero).

SUMMARY

Embodiments described herein provide a method for dynamically scaling log-likelihood ratio (LLR) values of received data bits before decoding the received data bits. A plurality of data bits are received corresponding to a data packet. A first set of data bits of a first type are determined from the plurality of data bits based on a modulation scheme corresponding to the received data bits. A first LLR histogram is generated corresponding to the first set of data bits of the first type. A first scaling factor is calculated based on the first LLR histogram such that a first LLR value range corresponding to the first set of data bits is expanded to a maximum LLR value range. All LLR values are then scaled corresponding to the plurality of data bits by the first scaling factor. The scaled LLR values corresponding to the plurality of data bits are sent to a decoder.

In some implementations, information relating to the modulation scheme from received data bits is identified, and a least reliable bit is determined in each constellation point in a modulation constellation corresponding to the modulation scheme. The first set of data bits of the first type are selected as a set of least reliable bits.

In some implementations, LLR values corresponding to each data bit from the plurality of data bits are calculated. A maximum value range of the LLR values is divided into a plurality of value bins. Absolute values corresponding to the LLR values are calculated. The calculated absolute values corresponding to the LLR values are sorted and distributed into the plurality of value bins. For each value bin from the plurality of value bins, an LLR count is calculated, indicating how many of the calculated absolute values belong to the respective value bin.

In some implementations, a most significant bin among the plurality of value bins is determined, from the first LLR histogram corresponding to the first set of data bits of the first type. A first scaling factor is calculated by dividing a maximum LLR value by an upper bound of the LLR value range corresponding to the most significant bin.

In some implementations, a value bin having a maximum LLR count is identified as the most significant bin. Or, the right-most value bin that has an LLR count greater than a threshold on the first LLR histogram is identified as the most significant bin.

In some implementations, a second set of data bits of a second type from the plurality of data bits are determined based on the modulation scheme corresponding to the received data bits. A second LLR histogram is generated corresponding to the second set of data bits of the second type. A mapping relationship is generated between LLR values on the first LLR histogram to LLR values on the second LLR histogram. The first scaling factor is then mapped to a second scaling factor based on the mapping relationship, and all LLR values corresponding to the plurality of received data bits are scaled.

In some implementations, the second set of data bits of the second type are selected as a set of less reliable bits corresponding to a data bit that is different from a least reliable bit for each constellation point in a modulation constellation corresponding to the modulation scheme.

In some implementations, a third LLR histogram is generated based on LLR values corresponding to a combination of a first percentage of the first set of data bits of the first type and a second percentage of the second set of data bits of the second type. A third scaling factor is calculated based on the third LLR histogram.

In some implementations, when a value bin close to zero on the first LLR histogram contains a significant number of LLR values, an additional scaling factor is determined to expand an LLR value range corresponding to the value bin close to zero.

In some implementations, the first scaling factor is calculated based on received data bits corresponding to a preamble of the data packet. LLR values are scaled corresponding to received data bits corresponding to a remaining part of the data packet. Data bits corresponding to a next data packet are received. In response to receiving data bits corresponding to the next data packet, a second scaling factor is calculated based on received data bits corresponding to a preamble of the next data packet, and scaling LLR values corresponding to received data bits of the next data packet using the second scaling factor.

Embodiments described herein further provide a system for dynamically scaling log-likelihood ratio (LLR) values of received data bits before decoding the received data bits. The system includes a receiver configured to receive a plurality of data bits corresponding to a data packet. The system further includes an LLR histogram generator configured to determine a first set of data bits of a first type from the plurality of data bits based on a modulation scheme corresponding to the received data bits, and generate a first LLR histogram corresponding to the first set of data bits of the first type. The system further includes a dynamic scaling module configured to calculate a first scaling factor based on the first LLR histogram such that a first LLR value range corresponding to the first set of data bits is expanded to a maximum LLR value range, scale all LLR values corresponding to the plurality of data bits by the first scaling factor, and send the scaled LLR values corresponding to the plurality of data bits to a decoder.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for an LLR-based dynamic scaling scheme to improve decoder performance in a fixed-point decoder. For example, a decoder, such as a low-density parity-check (LDPC) decoder, a binary convolution code decoder (or any other binary combinatory decoder) is configured to decode a code block containing a plurality of data bits. To decode the received data bits, the LLR value of each data bit is generated, based on which the decoder determines whether the transmitted data bit is one or zero. For example, for each received data bit, the LLR is calculated as:

$$LLR = \log\left(\frac{\text{Probability of the data bit being equal to 0}}{\text{Probability of the data bit being equal to 1}}\right)$$

A positive LLR indicates a greater probability of the data bit being equal to 0, and a negative LLR indicates a greater probability of the data bit being equal to one. The magnitude of the LLR provides a reliability of the estimation, e.g., $|LLR|=0$ indicates the estimation is unreliable as the data bit has an equal chance of being zero or one; and $|LLR|$ being a higher value indicates that the data bit value being zero or one is more reliable. LLR pre-processing at a receiver is configured to scale the LLR values corresponding to the received data bits such that the scaled LLR values occupy a maximum value range defined by the number of data bits used to represent the LLR value. A constant scaling factor needs to be applied to all LLR values corresponding to data bits in a received packet. However, the distribution of LLR values even within the same packet can vary with channel conditions, MCS, the received signal power level, and/or the like. Finding a particular scaling factor for all received data bits across all different scenarios can be difficult.

Embodiments described herein provide an LLR-based scheme to determine a scaling factor based on the LLR histogram corresponding to a subset of the received data bits, e.g., the least reliable bits, such that the LLR value range corresponding to the least reliable bits can be scaled to occupy the maximum LLR value range defined by the number of data bits representing the LLR value. In this way, lower LLR values corresponding to the least reliable bits are scaled to higher values to improve decoding performance. Higher LLR values, when scaled by the same scaling factor, may exceed and thus be assigned, the maximum LLR value defined by the number of data bits representing the LLR value, which does not affect the decoder performance because data bits corresponding to higher LLR values already yield high decoding reliability. Therefore, by focusing on scaling the LLR values of the less reliable data bits to meet the maximum LLR value range, the overall decoder performance can be improved.

Figure 1:
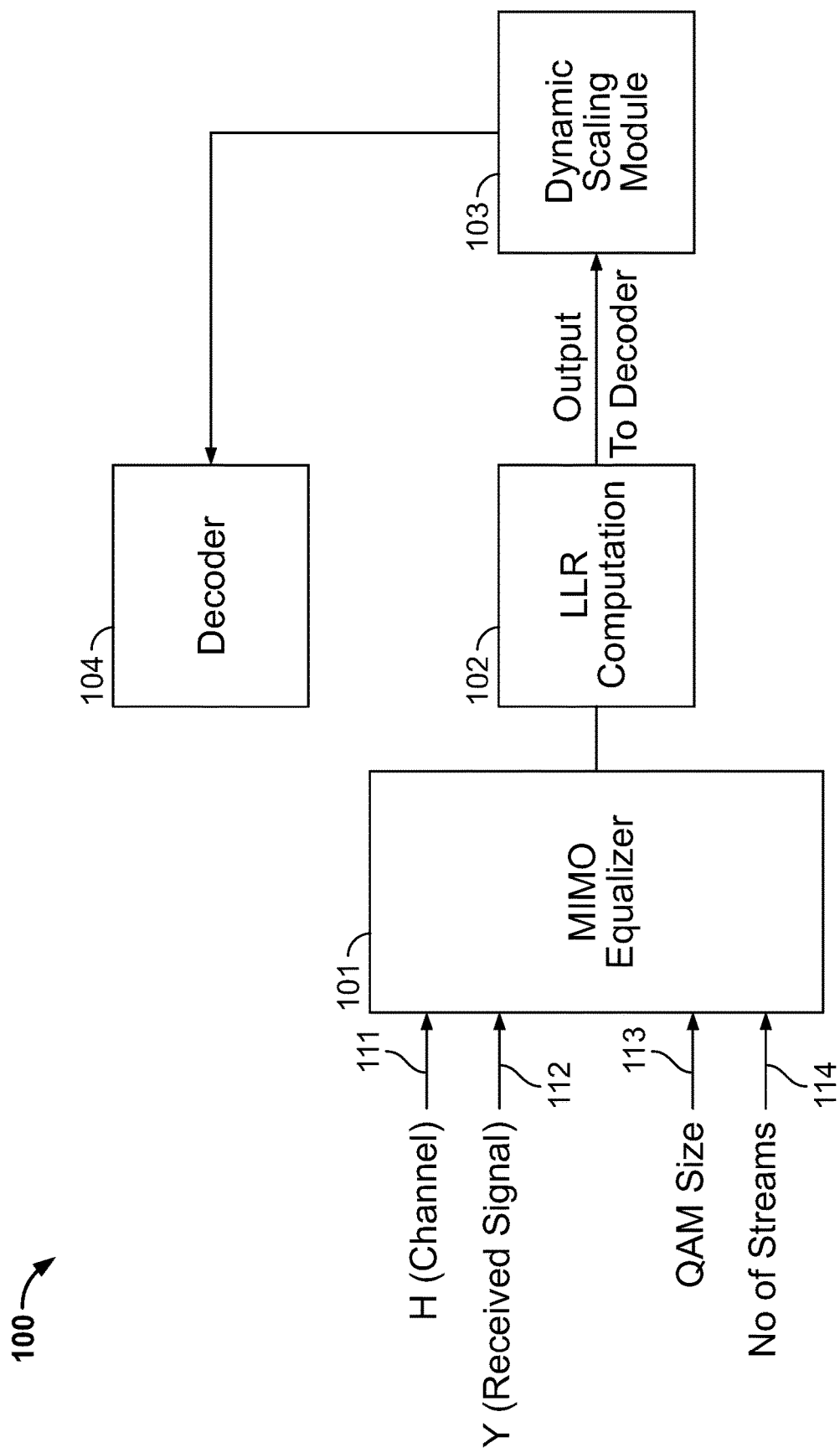
FIG. 1 is a block diagram illustrating an example circuit structure of a wireless receiver employing LLR-based dynamic scaling, according to some embodiments described herein.

FIG. 1 is a block diagram illustrating an example circuit structure of a wireless receiver employing LLR-based dynamic scaling, according to some embodiments described herein. A wireless receiver 100 is configured to be operated under a variety of wireless protocols, such as 802.11 standards, and/or the like. The wireless receiver 100 includes a multiple-input multiple-output (MIMO) equalizer 101, which is configured to quantize the received signal from the channel. For example, the received signal from the channel may include information such as but not limited to the channel information 111, a data signal 112, information relating to the modulation scheme (e.g., the QAM size) 113, the number of data streams 114 from channel, and/or the like.

The MIMO equalizer 101 is configured to send quantized data bits to the LLR computation module 102, which is in turn configured to calculate LLR values for each data bit, and generate an LLR histogram based on the calculated LLR values. Further detail on generating an LLR histogram is described in relation to FIG. 4.

The LLR computation module 102 is configured to send LLR values and/or LLR histogram information to a dynamic scaling module 103, which is configured to determine a scaling factor based on the LLR histogram. Further detail on determining a scaling factor and scaling the LLR values is described in relation to FIGS. 2 and 7. The dynamic scaling module 103 is configured to send the scaled LLR values to the decoder 104.

Figure 2:
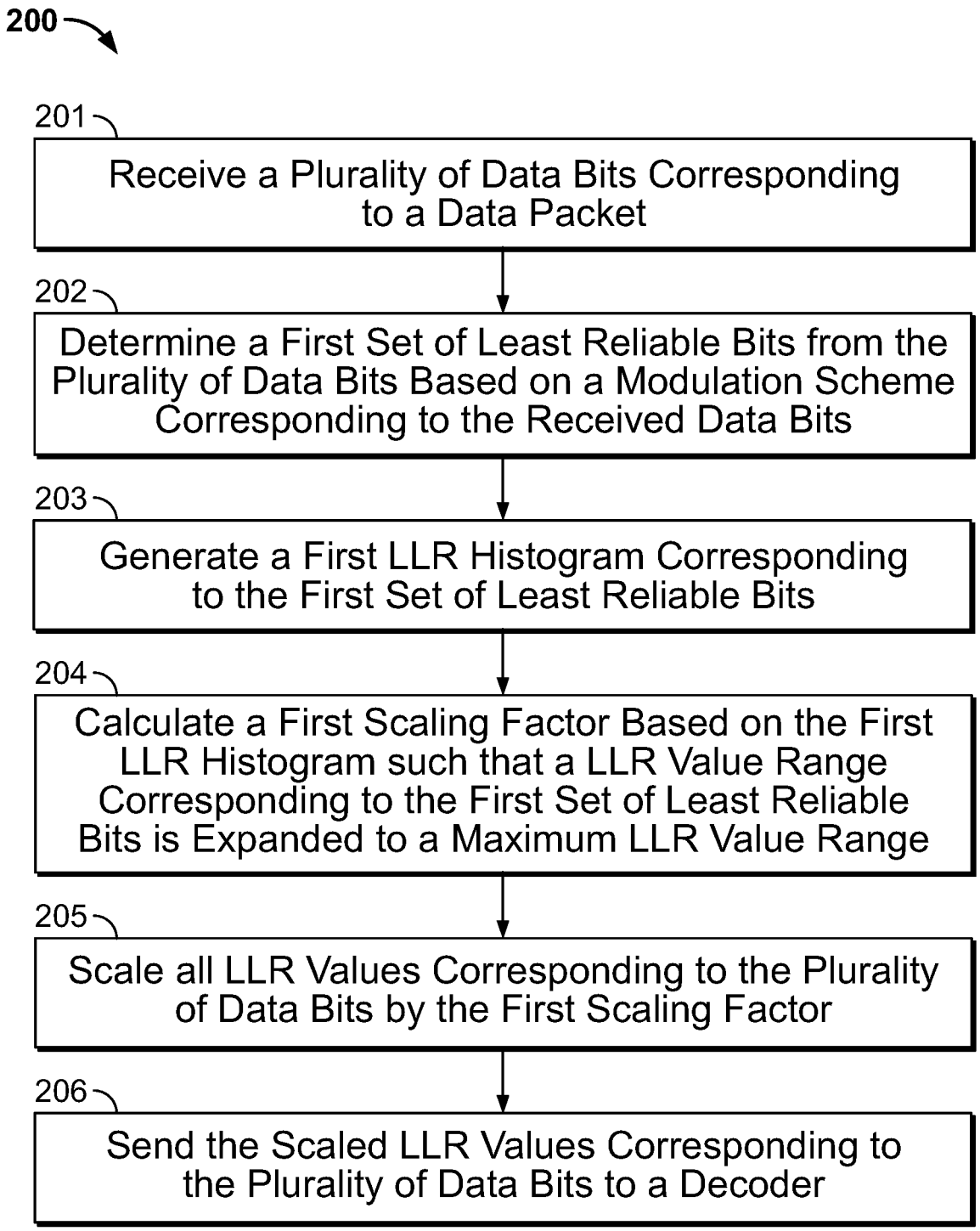
FIG. 2 is a logic flow diagram illustrating an example process of dynamically scaling LLR values of received data bits before decoding the data bits, which is implemented via the circuit structure illustrated in FIG. 1, according to some embodiments described herein.

FIG. 2 is a logic flow diagram illustrating an example process 200 of dynamically scaling LLR values of received data bits before decoding the data bits, which is implemented via the circuit structure illustrated in FIG. 1, according to some embodiments described herein. At 201, a plurality of data bits is received, e.g., at the MIMO equalizer 101, corresponding to a data packet. At 202, a first set of least reliable bits from the plurality of data bits is determined based on a modulation scheme corresponding to the received data bits. For example, the MIMO equalizer 101 may identify the modulation scheme of the received data, e.g., the QAM size 113 (e.g., 64-QAM).

Figure 3:
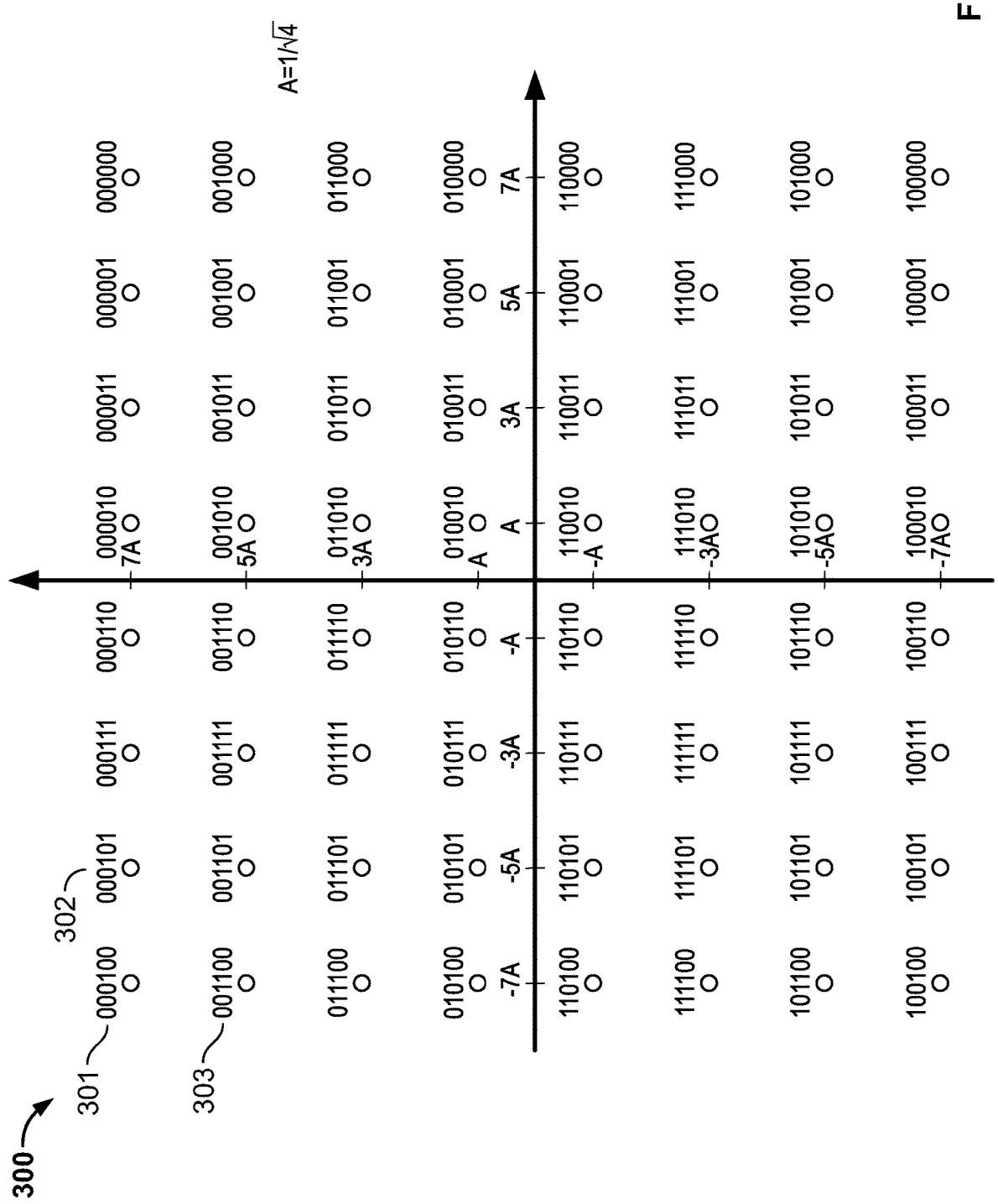
FIG. 3 is an example data plot diagram illustrating example least reliable bits and most reliable bits in a 64-quadrature amplitude modulation (QAM), which is identified at the LLR histogram generator in FIG. 1, according to some embodiments described herein.

As shown in the example data plot diagram illustrating example least reliable bits and most reliable bits in a 64-QAM 300 in FIG. 3, each constellation point, e.g., 301-303, in the 64-QAM 300, is represented by six data bits. Data bits that frequently change for neighboring constellation points are considered less reliable, as different values of these data bits are transmitted per each constellation point and thus these data bits are more likely to end up in a decoding error due to less redundancy. Data bits that remain the same for neighboring constellation points are considered more reliable, as the same value of these data bits is transmitted for a subset of constellation points and thus these data bits are less likely to end up in a decoding error due to redundancy. For example, if each constellation point is represented by "$b_0 b_1 b_2 b_3 b_4 b_5$," the least reliable bits are "$b_2$" and "$b_5$." The bit "$b_5$" flips between the constellation point 301 (represented by "000100") and the neighboring constellation point 302 (represented by "000101") and the bit $b_2$ flips between the constellation 301 and the constellation point 303 (represented by "001100"). Thus, in the constellation, two least reliable bits for each constellation point are defined, each of which flips along the x-axis (e.g., see bit $b_5$) or along the y-axis (e.g., see bit $b_2$), respectively.

Figure 4:
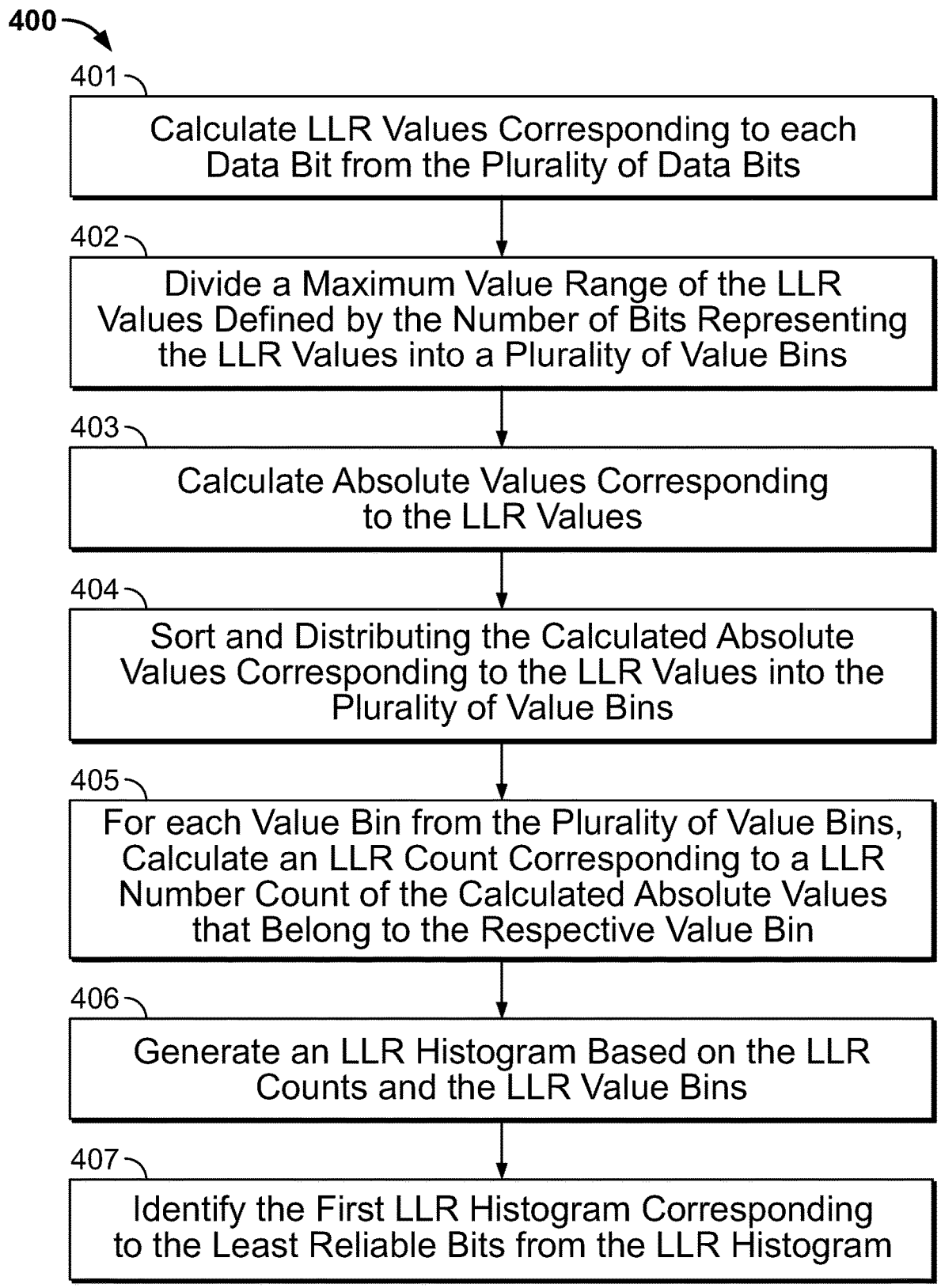
FIG. 4 is a logic flow diagram illustrating an example process of generating an LLR histogram for the least reliable bits, which is implemented at the LLR histogram generator in FIG. 1, according to some embodiments described herein.

Referring to FIG. 2, at 203, upon determining the first set of least reliable bits, a first LLR histogram is generated, e.g., by the LLR computation module 102 in FIG. 1, corresponding to the first set of least reliable bits, which is also further described in FIG. 4. At 204, a first scaling factor is calculated, e.g., at the dynamic scaling module 103 in FIG. 1, based on the first LLR histogram such that a LLR value range corresponding to the first set of least reliable bits is expanded to a maximum LLR value range, which is further described in FIG. 7. At 205, all LLR values corresponding to the plurality of data bits are then scaled, at the dynamic scaling module 103 in FIG. 1, by the first scaling factor. At 206, the scaled LLR values corresponding to the plurality of data bits are then sent to a decoder, e.g., 104 in FIG. 1.

FIG. 4 is a logic flow diagram illustrating an example process 400 of generating an LLR histogram for the least reliable bits (e.g., see 203 in FIG. 2), which is implemented at the LLR histogram generator in FIG. 1, according to some embodiments described herein. At 401, the LLR values corresponding to each data bit from the plurality of data bits are calculated. For example, each LLR value is represented by a number of data bits, e.g., six, seven, eight, and/or the like. The number n of data bits representing the LLR value defines the value range for the LLR value, e.g., the LLR value belongs to a range of $[-2^{n-1}, 2^{n-1}]$, with one bit representing the sign of the LLR value.

At 402, the maximum value range of the LLR values defined by the number of bits representing the LLR values is divided into a plurality of value bins. The value bins take a form as a series of consecutive LLR value ranges within the maximum value range. For example, the LLR value bins can be linearly distributed, e.g., $[0,\Delta), [\Delta,2\Delta), [2\Delta,3\Delta), \ldots, [(2^{n-1}-1)\Delta, 2^{n-1}\Delta)]$, where the value of $\Delta$ can be chosen based on the various system parameters of communication link. For another example, the LLR value bins can be logarithmically distributed, e.g., $[0,\Delta), [\Delta,2\Delta), [2\Delta,4\Delta), \ldots, [(2^{n-2})\Delta, 2^{n-1}\Delta)]$. The parameter $\Delta$ can be chosen based on accuracy required by the communication system, e.g., the smaller the value of $\Delta$ is, the more value bins for LLR values are used and thus the accuracy is improved. In one example, if $\Delta=\frac{1}{8}$, the LLR value bins are $[0, \frac{1}{8}), [\frac{1}{8}, \frac{2}{8}), [\frac{2}{8}, \frac{3}{8}), \ldots$ for linear bins and $[0, \frac{1}{8}), [\frac{1}{8}, \frac{1}{4}), [\frac{1}{4}, \frac{1}{2}), [\frac{1}{2}, 1), [1, 2) \ldots$ for logarithmic bins.

At 403, absolute values corresponding to the LLR values are calculated. At 404, the calculated absolute values corresponding to the LLR values are sorted and distributed into the plurality of value bins defined at 402. At 405, for each value bin from the plurality of value bins, an LLR count corresponding to the calculated absolute values that belong to the value range of the respective value bin is calculated. At 406, an LLR histogram is generated based on the LLR value bins (the X-axis) and the LLR count (the Y-axis) corresponding to each LLR value bin. As LLR distribution is usually symmetric on both sides of the axis, the generated LLR histogram can be flipped to a different side on the X-axis to generate the other half of the LLR histogram. At 407, a first LLR Histogram corresponding to the least reliable bits, which is a subset of the generated LLR histogram, is identified from the LLR Histogram, e.g., based on the least reliable bits determined at 202. Alternatively, starting from 202, the LLR values corresponding to different types of data bits (e.g., least reliable bits, most reliable bits, etc.) are calculated separately and thus separate LLR histograms corresponding to different types of data bits are generated.

It is noted that process 400 can be applied to use the LLR values for all data bits available in a packet for histogram computation, or a subset of LLR values can be used (e.g., only LLR values for data bits from the preamble).

Figure 5:
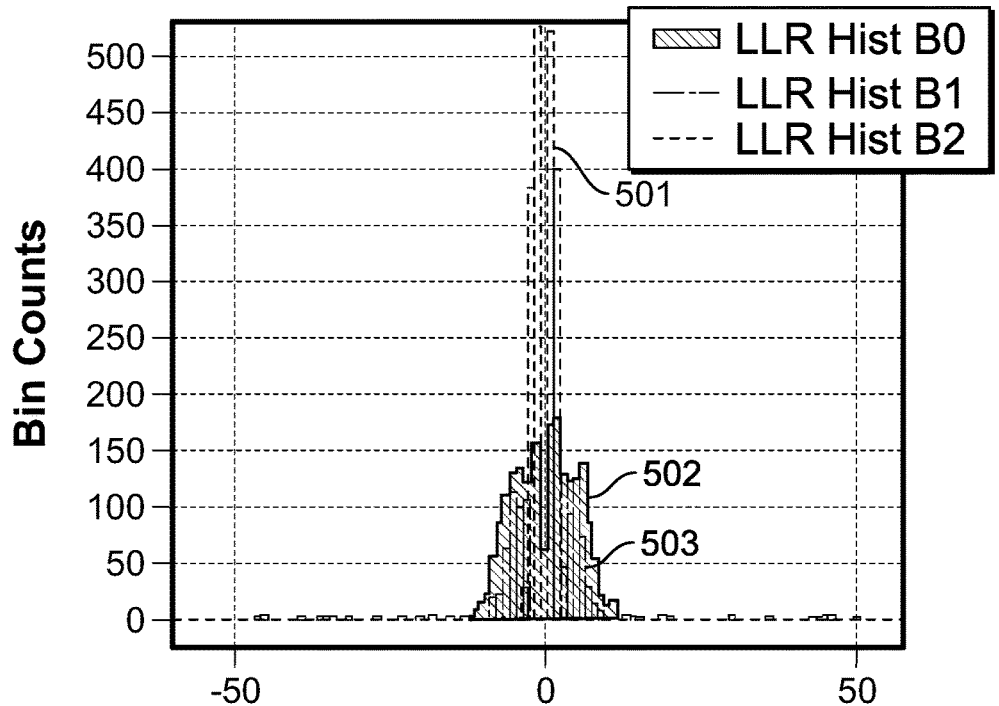
FIGS. 5-6 are example data plot diagrams illustrating example LLR histograms corresponding to least reliable bits and most reliable bits under different channels, which is obtained via the process illustrated in FIG. 4, according to some embodiments described herein.
Figure 6:
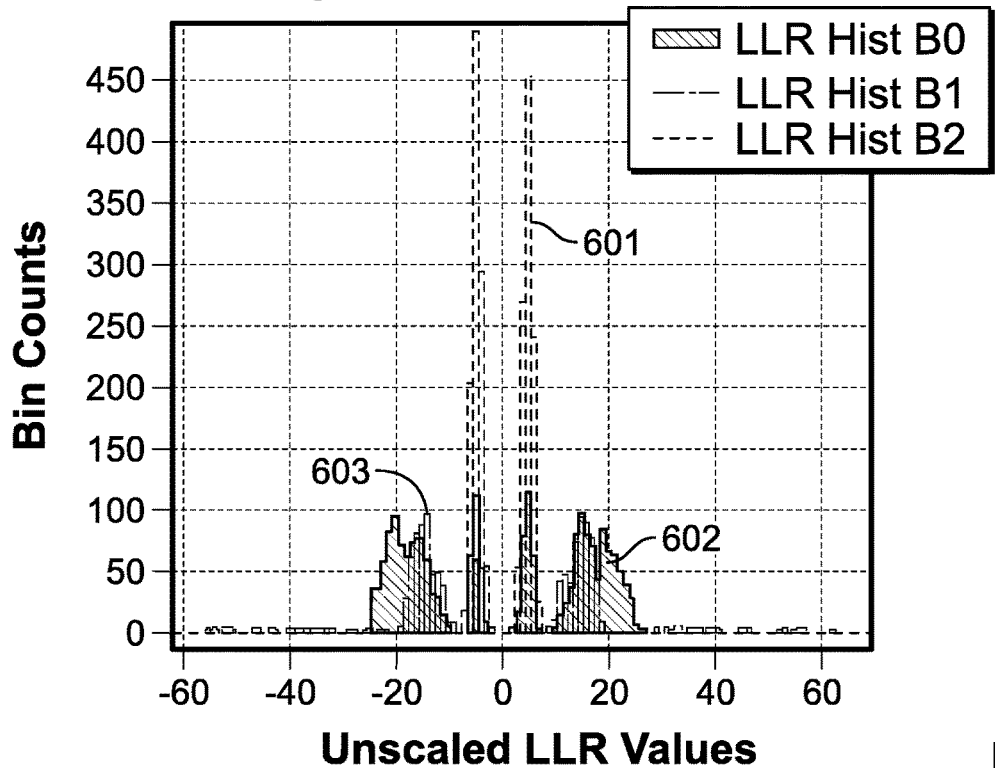

FIGS. 5-6 are example data plot diagrams illustrating example LLR histograms corresponding to least reliable bits and most reliable bits under different channels, which is obtained via the process illustrated in FIG. 4, according to some embodiments described herein. Histogram 500 in FIG. 5 shows an LLR histogram for data bits encoded by 64-QAM received from a non-line-of-sight wireless channel. Bars 501 represent the LLR histogram corresponding to the least reliable bit (e.g., the third bit "$b_2$" out of the six gray mapping bits representing 64-QAM constellation points, shown in FIG. 3), which generally belong to LLR value bins that are close to zero. Bars 502 and 503 represent the LLR histograms corresponding to more reliable bits (e.g., the first "$b_0$", and the second "$b_1$" out of the six gray mapping bits representing 64-QAM constellation points, shown in FIG. 3), which generally has higher LLR values. Similarly, histogram 600 in FIG. 6 shows an LLR histogram for data bits encoded by 64-QAM received from an additive white Gaussian noise (AWGN) channel. Bars 601 represent the LLR histogram corresponding to the least reliable bit (e.g., the third "b₂" out of the six gray mapping bits representing 64-QAM constellation points, shown in FIG. 3), which generally belong to LLR value bins that are closer to zero. Bars 602 and 603 represent the LLR histograms corresponding to more reliable bits (e.g., the first, and the second out of the six gray mapping bits representing 64-QAM constellation points, shown in FIG. 3), which generally have higher LLR values.

Figure 7:
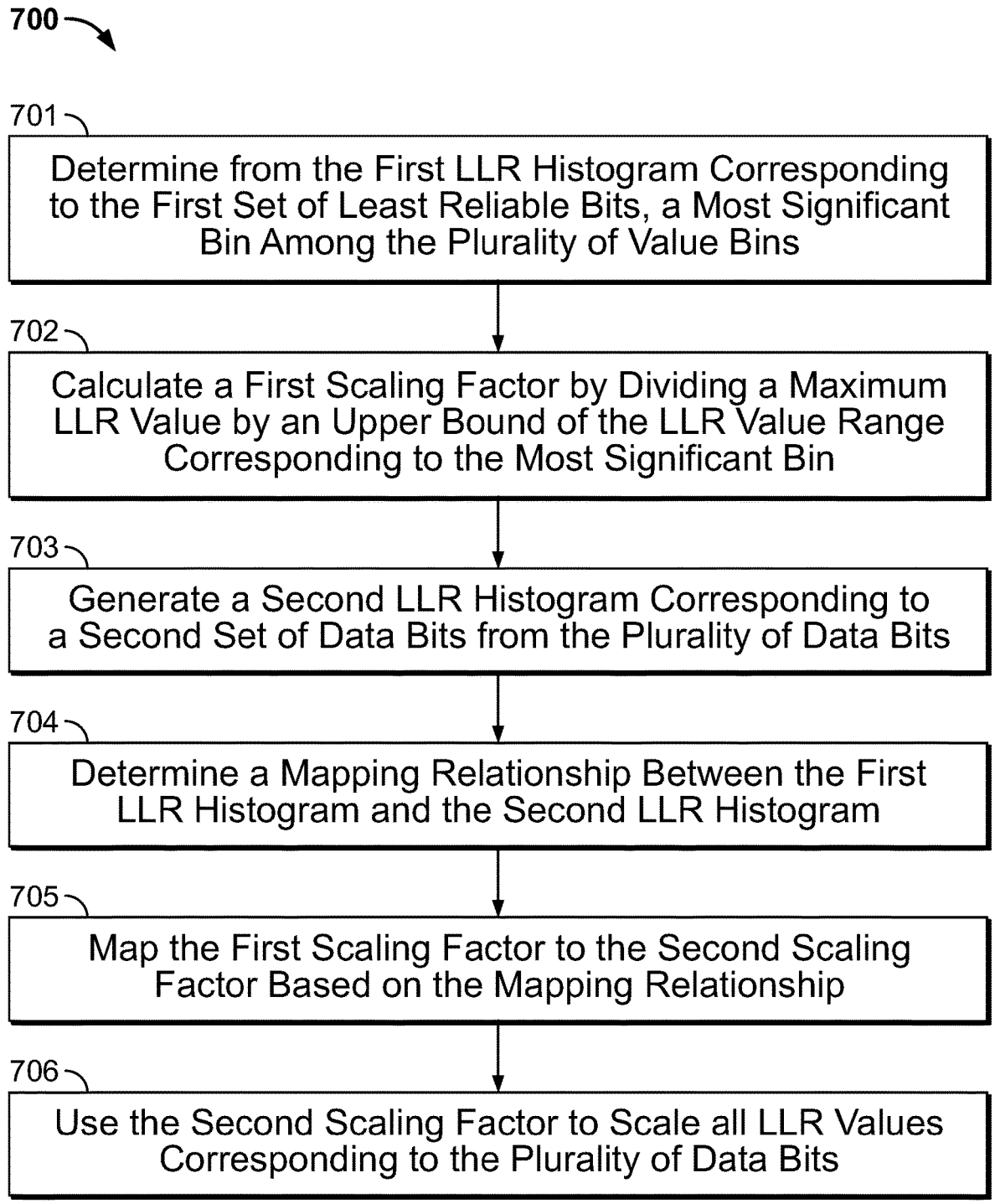
FIG. 7 is a logic flow diagram illustrating an example process of generating a scaling factor based on the LLR histogram for different types of data bits, which is implemented at the dynamic scaling module in FIG. 1, according to some embodiments described herein.

FIG. 7 is a logic flow diagram illustrating an example process 700 of generating a scaling factor based on the LLR histogram for different types of data bits, which is implemented at the dynamic scaling module 103 in FIG. 1, according to some embodiments described herein. At 701, it is determined that from the first LLR histogram corresponding to the first set of least reliable bits, a most significant bin among the plurality of value bins. For example, the most significant bin is selected as the value bin on the first LLR histogram that has a maximum LLR number count. For another example, the most significant bin is selected as the value bin as the right-most value bin among the value bins on the first histogram that have an LLR count greater than a threshold.

At 702, a first scaling factor is calculated by dividing a maximum LLR value by an upper bound of the LLR value range corresponding to the most significant bin. For example, on a histogram with logarithmically distributed bins, if the bin [4Δ,8Δ] is determined to be the most significant bin, the scale factor is computed as $2^{n-2}/\Delta$. In this example, the bin [4Δ,8Δ] is scaled to [$2^{n-2}$, $2^{n-1}$] which reaches the maximum LLR value. In other examples, the scaling factor is chosen based on other characteristics of the most significant bin, e.g., the lower bound of the most significant bin is to be scaled to the maximum LLR value, the median or mean value of the most significant bin is to be scaled to the maximum LLR value, and/or the like.

In this way, as described at 702, the scale factor is chosen in a way such that the LLR value range of the least reliable bit can occupy the LLR value range, and specifically, a large number of LLR values on the histogram corresponding to the least reliable bit are scaled to higher LLR values (e.g., close to the maximum LLR value). Decoder performance is improved with the scaled high LLR values corresponding to the least reliable bits, as the least reliable bits has the least minimum distance on a decoding constellation compared to other bits.

It is noted that when all data bits are scaled by the scaling factor defined in 702, higher reliability data bits that have a higher LLR value range may be saturated, e.g., the scaled LLR value range may exceed the maximum LLR value. When the saturation occurs, the LLR value for such higher reliability data bits is denoted as the maximum LLR value, as these higher reliability data bits originally have a reliable LLR value to decode from, and decoder performance is not affected adversely by saturating high reliability bits LLRs. s In some embodiments, one or more LLR counts within the most significant bin may be scaled by a pre-computed value to improvise the histogram before computing the scale factor as described by 702. For example, the LLR count corresponding to each value bin may be adjusted according to different channel conditions.

In some embodiments, the scaling factor determined at 702 may include an additional scaling procedure when there are a significant number of LLR values in the first bin, i.e., when a significant number of LLR values are close to zero. For example, as shown in FIGS. 5-6, data bits received from an AWGN channel may result in higher LLR values as compared with those received from a NLOS channel. At 600 in FIG. 6 which relates to LLR histograms corresponding to an AWGN channel, a value bin close to zero may have a zero LLR count. At 500 in FIG. 5 which relates to LLR histograms corresponding to a NLOS channel, a value bin close to the maximum LLR value may have a zero LLR count. Thus, for a LLR histogram similar to 500 in FIG. 5, additional scaling in addition to the scaling factor defined at 702 can be applied to further expand the LLR value range of the first bin when the first bin has a relatively large LLR value count.

The scaling factor may be determined based on the LLR histogram corresponding to the least reliable bit in a constellation point, or another bit in the constellation point, or a LLR histogram corresponding to a combination of a few less reliable bits. For example, the scaling factor can be chosen based on the LLR histogram corresponding to the $k^{th}$ least reliable bits (e.g., k=1 means choosing the least reliable bit) such that the LLR value range corresponding to the $k^{th}$ least reliable bit occupies the maximum range of LLR values. The value of k may be dynamically chose based on the architecture of the communication system and configuration, channel condition, and/or the like. To obtain a second scaling factor based on the LLR histogram corresponding to the $k^{th}$ least reliable bits, a mapping relationship between the LLR histograms corresponding to different types of data bits can be used to map one scaling factor to another scaling factor.

Figure 8:
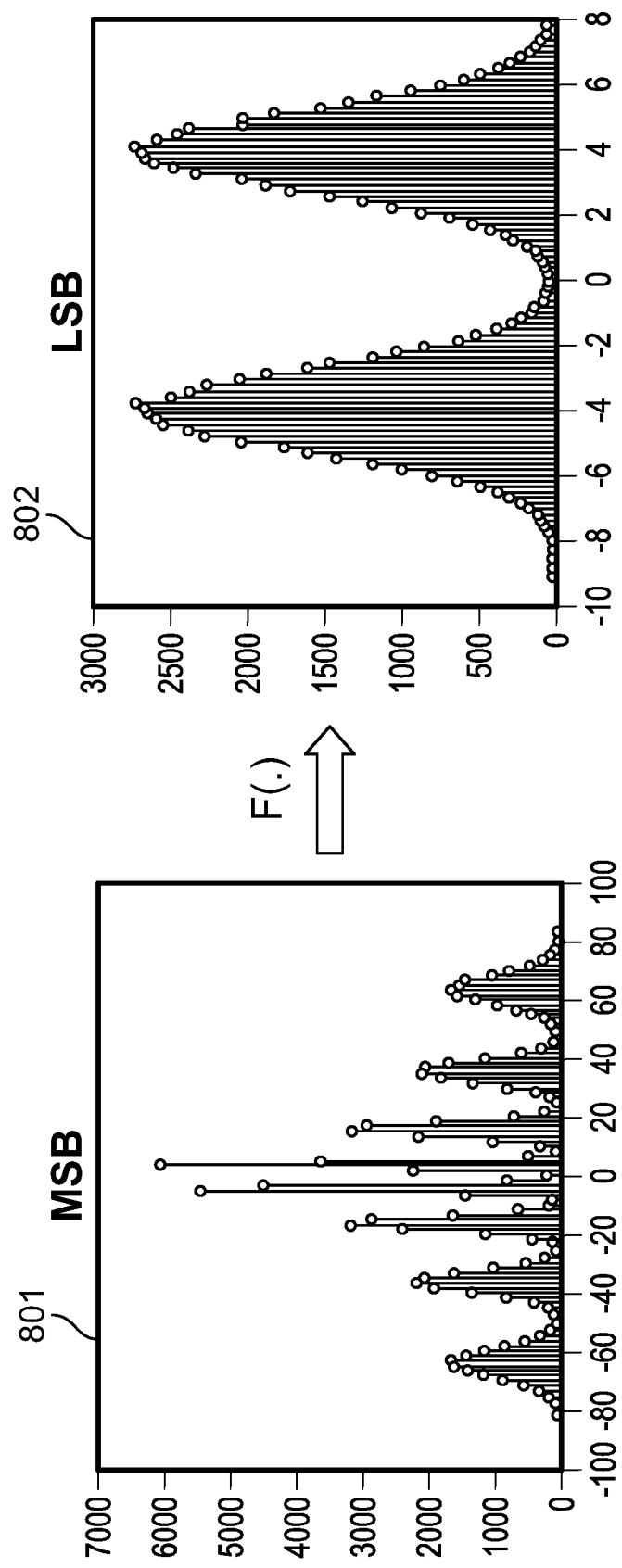
FIG. 8 is an example data plot diagram illustrating an example mapping between LLR histograms corresponding to least reliable bits and most reliable bits under different channels, which is used to generate a dynamic scaling factor in the process illustrated in FIG. 7, according to some embodiments described herein.

At 703, a second LLR histogram corresponding to a second set of data bits from the plurality of data bits is optionally generated, e.g., using a similar process as described in FIG. 4. At 704, a mapping relationship between the first LLR histogram and the second LLR histogram is determined. For example, based on the LLR characteristics of different data bits in a given constellation point, a mapping relation can be established between the LLR values corresponding to different data bits. As shown in the example data plot diagram illustrating an example mapping between LLR histograms corresponding to least reliable bits and most reliable bits under different channels in FIG. 8, LLR histogram 801 is generated from LLR values corresponding to the most significant bits in a 64-QAM (e.g., see 300 in FIG. 3), and LLR histogram 802 is generated from LLR values corresponding to the least significant bits in the 64-QAM. For each constellation point (e.g., see 301-303 in FIG. 3) in the 64-QAM, data samples of (LLR value of the least significant bit of the respective constellation point, LLR value of the most significant bit of the respective constellation point) can be used to establish a mapping relationship: LLR for least significant bits=F (LLR for most significant bits). The mapping function F(•) may be pre-defined or computed offline, e.g., based on characteristics of the particular modulation scheme used, such as the 64-QAM. Similarly, the mapping relationship between two other types of bits, e.g., the $k^{th}$ least reliable bits and the $m^{th}$ least reliable bits (k≠m), can be obtained in a similar way.

At 705, the first scaling factor (e.g., obtained at 702 based on the least significant bits) is mapped to the second scaling factor based on the mapping relationship, e.g., the mapping function F(•) as described above. At 706, the second scaling factor, and/or the first scaling factor is used to scale all LLR values corresponding to the plurality of data bits.

As described in the process 700 in FIG. 7, the scaling factor can be determined based on the LLR histogram corresponding to any bit of a constellation point, and one scaling factor corresponding to a first bit of a constellation point can be mapped to another scaling factor corresponding to a second bit of the constellation point. The scaling factor can also be determined upon a LLR histogram generated from LLR values corresponding to a combination of different types of data bits, e.g., any of the $k^{th}$ least reliable bits and the $m^{th}$ least reliable bits (k≠m), or a different percentage of different types of data bits. For example, the scaling factor may be determined upon a LLR histogram generated from LLR values corresponding to 30% of the $k^{th}$ least reliable bits and 70% of the $m^{th}$ least reliable bits (k≠m), or any other percentage.

In some embodiments, the scaling factor determined at 702 may be chosen dynamically. For example, a receiver is configured to receive data bits from the channel, and generate LLR histograms based on the received data bits intermittently, constantly, or periodically. For another example, the receiver is configured to re-calculate LLR histograms and a scaling factor when the modulation scheme, the channel condition, the decoder type, or other configuration parameters have changed. For another example, the receiver is configured to calculate a scaling factor based on LLR histograms generated from data bits corresponding to the preamble or any other portion of a data packet, and use the scaling factor to scale LLR values corresponding to data bits that belong to the remaining of the data packet.

Various embodiments discussed in conjunction with FIGS. 1-7 are performed by various electronic components of one or more electronic circuits, such as but not limited to an integrated circuit, and/or the like. Various components discussed throughout this disclosure such as, but not limited to a wireless receiver (e.g., 100 in FIG. 1), an MIMO equalizer (e.g., 101 in FIG. 1), an LLR histogram generator (e.g., 102 in FIG. 1), a dynamic scaling module (e.g., 103 in FIG. 1), and/or the like, are configured to include a set of electronic circuit components, and communicatively operate on one or more electronic circuits. Each electronic circuit is configured to include any of, but not limited to logic gates, memory cells, amplifiers, filters, and/or the like. Various embodiments and components disclosed herein. such as but not limited to process 200 in FIG. 2, process 400 in FIG. 4 and process in FIG. 7, are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 7 does not necessarily require the particular order shown, or sequential order, to achieve desirable results. In certain implementations, multitasking and parallel processing may be advantageous. Other variations are within the scope of the following claims.

What is claimed is:

1. A method for dynamically scaling log-likelihood ratio (LLR) values of received data bits before decoding the received data bits, the method comprising:
   receiving a plurality of data bits corresponding to a data packet;
   determining a first set of data bits of a first type from the plurality of data bits based on a modulation scheme corresponding to the received data bits;
   generating a first LLR histogram corresponding to the first set of data bits of the first type, wherein the first set of data bits is less than the received plurality of data bits;
   calculating a first scaling factor based on the first LLR histogram such that a first LLR value range corresponding to the first set of data bits is expanded to a maximum LLR value range;
   scaling all LLR values corresponding to the plurality of data bits by the first scaling factor; and
   sending the scaled LLR values corresponding to the plurality of data bits to a decoder.

2. The method of claim 1, wherein the determining the first set of data bits of a first type from the plurality of data bits based on the modulation scheme corresponding to the received data bits comprises:
   identifying information relating to the modulation scheme from received data bits;
   determining a least reliable bit in each constellation point in a modulation constellation corresponding to the modulation scheme; and
   selecting the first of data bits of the first type as a set of least reliable bits.

3. The method of claim 1, wherein the generating the first LLR histogram corresponding to the first set of data bits of the first type comprises:
   calculating LLR values corresponding to each data bit from the plurality of data bits;
   dividing a maximum value range of the LLR values into a plurality of value bins;
   calculating absolute values corresponding to the LLR values;
   sorting and distributing the calculated absolute values corresponding to the LLR values into the plurality of value bins; and
   for each value bin from the plurality of value bins, calculating an LLR count indicating how many of the calculated absolute values belong to the respective value bin.

4. The method of claim 1, wherein the calculating the first scaling factor based on the first LLR histogram such that the first LLR value range corresponding to the first set of data bits is expanded to the maximum LLR value range comprises:
   determining, from the first LLR histogram corresponding to the first set of data bits of the first type, a most significant bin among the plurality of value bins; and
   calculating a first scaling factor by dividing a maximum LLR value by an upper bound of the LLR value range corresponding to the most significant bin.

5. The method of claim 4, wherein the determining, from the first LLR histogram corresponding of the first set of data bits of the first type, the most significant bin among the plurality of value bins further comprises:
   identifying a value bin having a maximum LLR count as the most significant bin; or identifying a right-most value bin that has an LLR count greater than a threshold on the first LLR histogram.

6. The method of claim 4, further comprising:
determining a second set of data bits of a second type from the plurality of data bits based on the modulation scheme corresponding to the received data bits;
generating a second LLR histogram corresponding to the second set of data bits of the second type;
determining a mapping relationship between LLR values on the first LLR histogram to LLR values on the second LLR histogram;
mapping the first scaling factor to a second scaling factor based on the mapping relationship; and
scaling all LLR values corresponding to the plurality of received data bits.

7. The method of claim 6, further comprising:
selecting the second set of data bits of the second type to a set of less reliable bits corresponding to a data bit that is different from a least reliable bit for each constellation point in a modulation constellation corresponding to the modulation scheme.

8. The method of claim 6, further comprising:
generating a third LLR histogram based on LLR values corresponding to a combination of a first percentage of the first set of data bits of the first type and a second percentage of the second set of data bits of the second type; and
calculating a third scaling factor based on the third LLR histogram.

9. The method of claim 1, further comprising:
determining that a value bin close to zero on the first LLR histogram contains a significant number of LLR values; and
determining an additional scaling factor to expand an LLR value range corresponding to the value bin close to zero.

10. The method of claim 1, further comprising:
calculating the first scaling factor based on received data bits corresponding to a preamble of the data packet;
scaling LLR values corresponding to received data bits corresponding to a remaining part of the data packet;
receiving data bits corresponding to a next data packet;
calculating a second scaling factor based on received data bits corresponding to a preamble of the next data packet; and
scaling LLR values corresponding to the received data bits using the second scaling factor.

11. A system for dynamically scaling log-likelihood ratio (LLR) values of received data bits before decoding the received data bits, the system comprising:
a receiver configured to receive a plurality of data bits corresponding to a data packet;
an LLR histogram generator configured to determine a first set of data bits of a first type from the plurality of data bits based on a modulation scheme corresponding to the received data bits, and generate a first LLR histogram corresponding to the first set of data bits of the first type, wherein the first set of data bits is less than the received plurality of data bits; and
a dynamic scaling module configured to calculate a first scaling factor based on the first LLR histogram such that a first LLR value range corresponding to the first set of data bits is expanded to a maximum LLR value range, scale all LLR values corresponding to the plurality of data bits by the first scaling factor, and send the scaled LLR values corresponding to the plurality of data bits to a decoder.

12. The system of claim 11, wherein the LLR histogram generator, when determining the first set of data bits of a first type from the plurality of data bits based on the modulation scheme corresponding to the received data bits, is further configured to:
identify information relating to the modulation scheme from received data bits;
determine a least reliable bit in each constellation point in a modulation constellation corresponding to the modulation scheme; and
select the first of data bits of the first type as a set of least reliable bits.

13. The system of claim 11, wherein the LLR histogram generator, when generating the first LLR histogram corresponding to the first set of data bits of the first type, is further configured to:
calculate LLR values corresponding to each data bit from the plurality of data bits;
divide a maximum value range of the LLR values into a plurality of value bins;
calculate absolute values corresponding to the LLR values;
sort and distributing the calculated absolute values corresponding to the LLR values into the plurality of value bins; and
for each value bin from the plurality of value bins, calculate an LLR count indicating how many of the calculated absolute values belong to the respective value bin.

14. The system of claim 11, wherein the dynamic scaling module, when calculating the first scaling factor based on the first LLR histogram such that the first LLR value range corresponding to the first set of data bits is expanded to the maximum LLR value range, is further configured to:
determine, from the first LLR histogram corresponding to the first set of data bits of the first type, a most significant bin among the plurality of value bins; and
calculate a first scaling factor by dividing a maximum LLR value by an upper bound of the LLR value range corresponding to the most significant bin.

15. The system of claim 14, wherein the dynamic scaling module, when determining, from the first LLR histogram corresponding of the first set of data bits of the first type, the most significant bin among the plurality of value bins, is further configured to:
identify a value bin having a maximum LLR count as the most significant bin; or
identify a right-most value bin that has an LLR count greater than a threshold on the first LLR histogram.

16. The system of claim 14, wherein the dynamic scaling module is further configured to:
determine a second set of data bits of a second type from the plurality of data bits based on the modulation scheme corresponding to the received data bits;
generate a second LLR histogram corresponding to the second set of data bits of the second type;
determine a mapping relationship between LLR values on the first LLR histogram to LLR values on the second LLR histogram;
map the first scaling factor to a second scaling factor based on the mapping relationship; and
scale all LLR values corresponding to the plurality of received data bits.

17. The system of claim 16, wherein the dynamic scaling module is further configured to:
select the second set of data bits of the second type to a set of less reliable bits corresponding to a data bit that is different from a least reliable bit for each constellation point in a modulation constellation corresponding to the modulation scheme.

18. The system of claim 16, wherein the LLR histogram generator is further configured to generate a third LLR histogram based on LLR values corresponding to a combination of a first percentage of the first set of data bits of the first type and a second percentage of the second set of data bits of the second type, and the dynamic scaling module is further configured to calculate a third scaling factor based on the third LLR histogram.

19. The system of claim 11, wherein the dynamic scaling module is further configured to:
 determine that a value bin close to zero on the first LLR histogram contains a significant number of LLR values; and
 determine an additional scaling factor to expand an LLR value range corresponding to the value bin close to zero.

20. The system of claim 11, wherein the dynamic scaling module is further configured to calculate the first scaling factor based on received data bits corresponding to a preamble of the data packet,
 scale LLR values corresponding to received data bits corresponding to a remaining part of the data packet,
 in response to receiving data bits corresponding to a next data packet, calculate a second scaling factor based on received data bits corresponding to a preamble of the next data packet, and
 scale LLR values corresponding to the received data bits using the second scaling factor.

\* \* \* \* \*